United States Patent [19]

Tomita

[11] Patent Number: 5,671,173
[45] Date of Patent: Sep. 23, 1997

[54] SEMICONDUCTOR INTEGRATED CIRCUIT DEVICE WITH OBLIQUE METALLIZATION LINES OVER MEMORY BIT AND WORD LINES

[75] Inventor: Yasuhiro Tomita, Hyogo, Japan

[73] Assignee: Matsushita Electric Industrial Co., Ltd., Osaka, Japan

[21] Appl. No.: 789,124

[22] Filed: Jan. 27, 1997

Related U.S. Application Data

[63] Continuation of Ser. No. 489,113, Jun. 9, 1995, abandoned.

[30] Foreign Application Priority Data

Jun. 10, 1994 [JP] Japan .................................. 6-128943

[51] Int. Cl.⁶ .................................................. G11C 5/06
[52] U.S. Cl. ............................ 365/63; 365/72; 257/776
[58] Field of Search ........................ 365/73, 72; 257/776

[56] References Cited

U.S. PATENT DOCUMENTS

| | | | |
|---|---|---|---|
| 3,474,297 | 10/1969 | Bylander | 257/776 |
| 3,769,108 | 10/1973 | Feldman et al. | 257/776 |
| 4,673,966 | 6/1987 | Shimoyama | 257/776 |
| 5,075,753 | 12/1991 | Kozono | 257/776 |
| 5,111,271 | 5/1992 | Hatada et al. | 257/776 |
| 5,189,505 | 2/1993 | Bartelink | 257/776 |
| 5,309,015 | 5/1994 | Kawata et al. | 257/776 |
| 5,355,004 | 10/1994 | Saitoh | 257/776 |
| 5,362,984 | 11/1994 | Konda et al. | 257/776 |
| 5,373,188 | 12/1994 | Michii et al. | 257/776 |
| 5,459,356 | 10/1995 | Schulze et al. | 257/776 |
| 5,473,196 | 12/1995 | De Givry | 257/776 |

FOREIGN PATENT DOCUMENTS

| | | | |
|---|---|---|---|
| 2-146769 | 5/1990 | Japan . | |
| 4-23348 | 1/1992 | Japan | 257/776 |

*Primary Examiner*—Joseph E. Clawson, Jr.
*Attorney, Agent, or Firm*—McDermott, Will & Emery

[57] ABSTRACT

The present invention discloses a semiconductor integrated circuit device. This semiconductor integrated circuit has metal wiring layers of four levels including peripheral circuits of a memory module which are formed by word and bit lines in a lattice arrangement. The word lines are provided in the first-level metal wiring layer and the bit lines are provided in the second-level metal wiring layer. Provided in the third-level metal wiring layer is a first over-memory wire without direct access to any memory cell. A second over-memory wire without direct access to any memory cell is provided in the fourth-level metal wiring layer. The first and second over-memory wires for establishing connections between functional circuit blocks, are arranged in such a way that they extend across the word lines and the bit lines at an angle of 45 degrees.

10 Claims, 6 Drawing Sheets

F I G.1
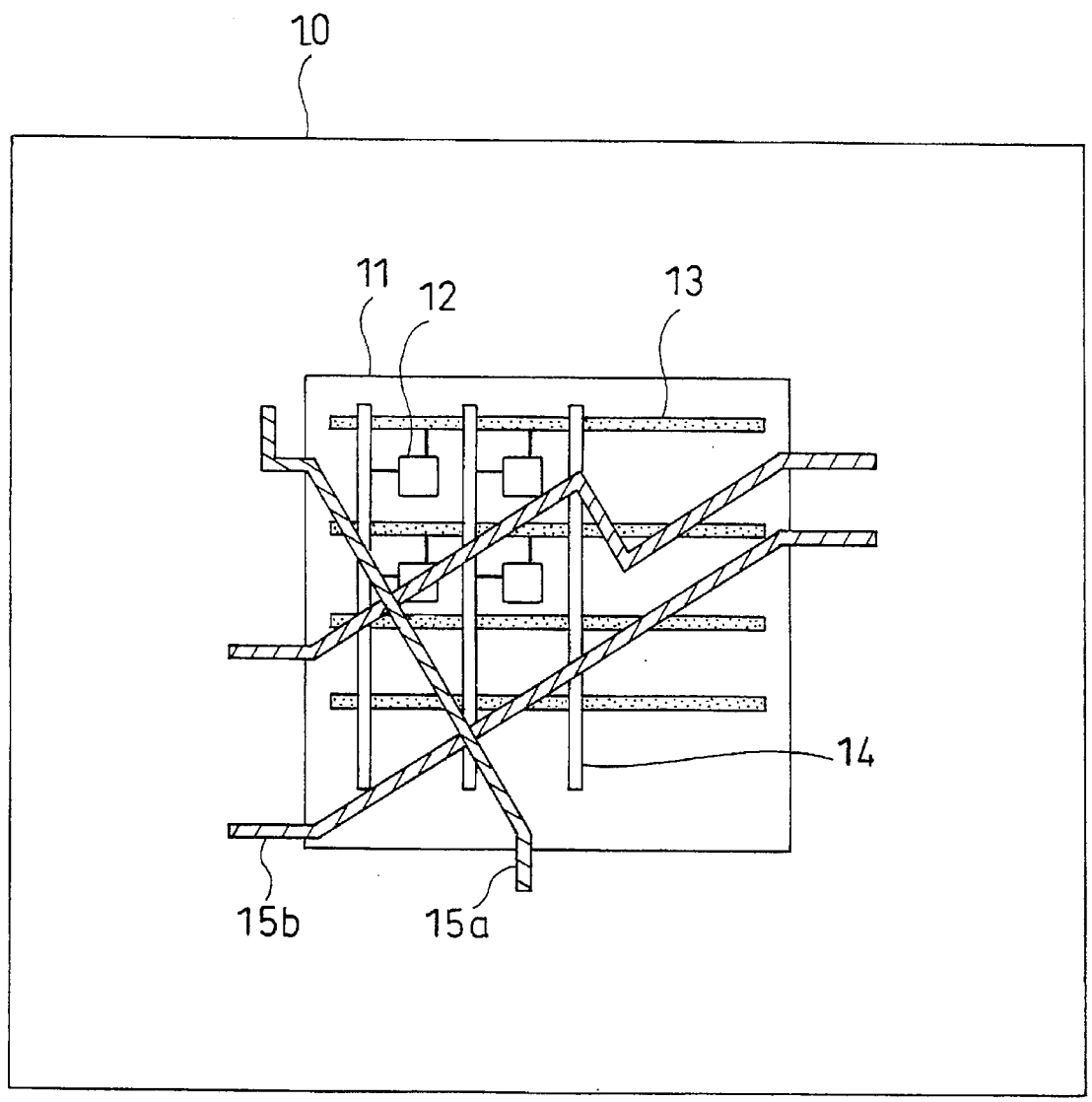

SEMICONDUCTOR INTEGRATED CIRCUIT DEVICE WITH OBLIQUE METALLIZATION LINES OVER MEMORY BIT AND WORD LINES

This is a continuation application of application Ser. No. 08/489,113, filed Jun. 9, 1995, now abandoned.

BACKGROUND OF THE INVENTION

1. Field of the Invention

The present invention relates generally to a semiconductor integrated circuit (SIC) device that includes a semiconductor memory such as RAM (Random Access Memory) and ROM (Read-Only Memory). More particularly, it pertains to an SIC device that has a memory module with an array of memory cells and a peripheral circuit capable of performing a storage operation with respect to the memory cell array, and an interblock wire for establishing a connection between functional circuit blocks or establishing a connection between a functional circuit block and a pad circuit block.

2. Background of the Invention

In a memory, e.g., RAM, its peripheral circuit containing bit lines and word lines in a lattice arrangement is used to read the desired data from a memory cell of the memory cell array or write the desired data in a memory cell of the memory cell array, wherein a small number of memory cells selected are associated with a single bit line and with a single word line. If an interblock wire is routed to pass over a memory module, then due to the coupling capacitance between the interblock wire and a bit (word) line noise is likely to be induced in the bit line. As a result, the possibility that a memory cell malfunction occurs increases. Particularly, where bit lines are precharged, the coupling capacitance between a bit line under precharge and an interblock wire becomes larger than previously, so that noise is likely to be produced in a memory cell.

Accordingly, it is required that interblock wires be routed in such a way as not to pass over a memory module.

However, arranging an interblock wire over a memory module has been regarded as a preferable way of downsizing semiconductor substrates. Therefore, in cases where arrangement that an interblock wire is placed over a memory module is unavoidable, a circuit simulator (e.g., SPICE) must be used after the interblock wire is formed, to confirm that the memory module operates normally. However, this produces the problem that the number of process steps becomes greater.

SUMMARY OF THE INVENTION

Bearing in mind the above-noted problem with the prior art technique, the present invention was made. Accordingly it is an object of the present invention to provide an improved technique capable of preventing a memory cell malfunction from occurring, even when an interblock wire is placed over a memory module.

The present invention was made from the following discovery. That is, when an interblock wire passes over a memory module extending across a bit line and a word line, the coupling capacitance between the interblock wire and each line becomes lower, thereby making the occurrence of memory cell malfunctions less likely.

The present invention provides a first SIC device. This first SIC device comprises:

- a semiconductor substrate which has a plurality of functional circuit blocks or a functional circuit block and a pad circuit block;
- a memory module which is formed on the semiconductor substrate and which has memory cells associated with respective word lines and bit lines;
- an over-memory wire which is formed on the semiconductor substrate in such a way as to pass over the memory module and extend across a bit line and a word line of the memory module and which establishes either a connection between functional circuit blocks of the aforesaid plural functional circuit blocks or a connection between the functional circuit block and the pad circuit block.

In accordance with the first SIC device, an over-memory wire passing over a memory module is intersected by a bit and a word line. As a result of such organization, the coupling capacitance between the over-memory wire and the bit line becomes low in comparison with an arrangement where an over-memory wire runs parallel with a bit or word line. Less noise is induced by the over-memory wire in the bit line.

Where plural over-memory wires pass over a memory module, it is unlikely that all the over-memory wires undergo signal transitions at the same time. Additionally, the ratio that the transition of H→L occurs and the ratio that the transition of L→H occurs are nearly equal, so that each H→L transition is offset by each L→H transition. The coupling noise is a differential component of the coupling capacitance between a signal transmitted over an over-memory wire and a signal transmitted over a bit or word line. In addition, coupling noise as a result of a signal on the over-memory wire making an H→L transition and coupling noise as a result of a signal on the over-memory wire making an L→H transition are of opposite type, so that the former is offset by the latter. Therefore, even if plural over-memory wires pass over a bit or word line, this will not increase the coupling capacitance between them. Less noise is produced.

To sum up, although the area of the semiconductor substrate is reduced by arranging wires over a memory module, memory cell malfunctions caused by noise can be prevented. The present invention can provide an improved SIC device which is inexpensive, dissipates less power, and operates at high speed.

The first SIC device may further comprise:

- an interblock wire which is formed on the semiconductor substrate in such a way as to avoid passing over the memory module and which establishes either a connection between functional circuit blocks of the plural functional circuit blocks or a connection between the functional circuit block and the pad circuit block;

wherein:

- a memory module rectangular coordinate system by which the word lines and the bit lines are positioned and an interblock wiring rectangular coordinate system by which the interblock wire is positioned cross each other at a rotation angle of 0 degree;
- the over-memory wire is routed in such a way so as to extend across a coordinate axis of the interblock wiring rectangular coordinate system.

As a result of such organization, the process of arranging an over-memory wire to be intersected by a bit or word line can be performed by changing only an over-memory wiring algorithm with the aid of a conventional wiring arrangement tool.

The first SIC device may further comprise:

- an interblock wire which is formed on the semiconductor substrate in such a way as to avoid passing over the memory module and which establishes either a connection between functional circuit blocks of the plural functional circuit blocks or a connection between the functional circuit block and the pad circuit block;

wherein:

a memory module rectangular coordinate system by which the word lines and the bit lines are positioned and an interblock wiring rectangular coordinate system by which the interblock wire is positioned cross each other at a rotation angle between 0 and 90 degrees;

the over-memory wire is routed in such a way so as to run parallel with or orthogonally extend across a coordinate axis of the interblock wiring rectangular coordinate system.

As a result of such organization, the process of arranging an over-memory wire to be intersected by a bit or word line can be performed by changing only an over-memory wiring algorithm with the aid of a conventional wiring arrangement tool.

The first SIC device may further comprise a pad circuit block for inputting a signal from outside the semiconductor integrated circuit device or outputting a signal to outside the semiconductor integrated circuit device, wherein the pad circuit block is arranged within a triangular region defined between the memory module and two adjacent functional circuit blocks of the plural functional circuit blocks.

As a result of such arrangement, the triangular regions, defined between the memory module and two adjacent functional circuit blocks, become available.

It is preferable that in the first SIC device the over-memory wire has a pair of wires capable of transmitting respective signals in a complementary relationship.

As a result of such arrangement, even if many over-memory wires simultaneously make transitions, the H→L transition and the L→H transition take place at the same ratio. Therefore, noises induced by the over-memory wires in the bit or word line are offset. Less noise is produced.

The first SIC device may further comprise:

a dummy over-memory wire which is formed on the semiconductor substrate;

the dummy over-memory wire passing over the memory module and being arranged parallel with and next to the over-memory wire;

the dummy over-memory wire transmitting a complement of a signal that is transmitted over the over-memory wire.

As a result of such arrangement, even if many over-memory wires simultaneously make transitions, the H→L transition and the L→H transition take place at the same ratio. Therefore, noises induced by the over-memory wires in the bit or word line are offset by the dummy over-memory wires. Less noise is produced.

The present invention provides a second SIC device. This second SIC device comprises:

a semiconductor substrate which has a plurality of functional circuit blocks or a functional circuit block and a pad circuit block;

a memory module which is formed on the semiconductor substrate and which has memory cells associated with respective word lines and bit lines;

an over-memory wire which is formed on the semiconductor substrate in such a way as to pass over the memory module and which establishes either a connection between functional circuit blocks of the aforesaid plural functional circuit blocks or a connection between the functional circuit block and the pad circuit block;

a dummy over-memory wire which is formed on the semiconductor substrate;

the dummy over-memory wire passing over the memory module and being arranged parallel with and next to the over-memory wire;

the dummy over-memory wire transmitting a complement of a signal that is transmitted over the over-memory wire.

As result of such arrangement, the over-memory wire and the dummy over-memory wire make logical transitions in opposite directions. For example, if the former makes an H→L transition, then the latter makes an L→H transition. In other words, the H→L transition and the L→H transition take place at the same ratio. Therefore, noises induced by the over-memory wires in the bit or word line are offset by the dummy over-memory wires. Less noise is produced.

In the second SIC device, the over-memory wire and the dummy over-memory wire may be placed between two adjacent bit lines of the memory module. Additionally, in the second SIC device, the over-memory wire and the dummy over-memory wire may be placed in such a way as to face each other across a bit line of the memory module.

Such organization assures that noises induced by the over-memory wires in the bit or word line are offset by the dummy over-memory wires.

The present invention provides a third SIC device. This third SIC device comprises:

a first semiconductor substrate and a second semiconductor substrate which has a plurality of functional circuit blocks or a functional circuit block and a pad circuit block;

a memory module which is formed on the first semiconductor substrate and which has memory cells associated with respective word lines and bit lines;

an over-memory wire which is formed on the second semiconductor substrate in such a way as to pass over the memory module and extend across a word line and a bit line of the memory module and which establishes either a connection between functional circuit blocks of the aforesaid plurality of functional circuit blocks or a connection between the functional circuit block and the pad circuit block;

wherein:

the first and second semiconductor substrates are integrally laminated together.

In accordance with the third SIC device, a memory module and an over-memory wire are provided on different semiconductor substrates thereby enabling the structure wherein an over-memory wire extends across a word or bit line to be formed easily.

It is preferable that in the third SIC device the over-memory wire may have a pair of wires capable of transmitting respective signals in a complementary relationship.

As a result of such arrangement, even if many over-memory wires simultaneously make transitions, the H→L transition and the L→H transition take place at the same ratio. Therefore, noises induced by the over-memory wires in the bit or word line are offset. Less noise is produced.

The third SIC device may further comprise:

a dummy over-memory wire which is formed on the second semiconductor substrate;

the dummy over-memory wire passing over the memory module and being arranged parallel with and next to the over-memory wire;

the dummy over-memory wire transmitting a complement of a signal that is transmitted over the over-memory wire.

As a result of such arrangement, even if many over-memory wires simultaneously make transitions, the H→L transition and the L→H transition take place at the same ratio. Therefore, noises induced by the over-memory wires in the bit or word line are offset by the dummy over-memory wires. Less noise is produced.

BRIEF DESCRIPTION OF THE DRAWING FIGURES

FIG. 1 illustrates the structure of a first SIC device of the present invention.

DETAILED DESCRIPTION OF THE INVENTION

Figure 2:
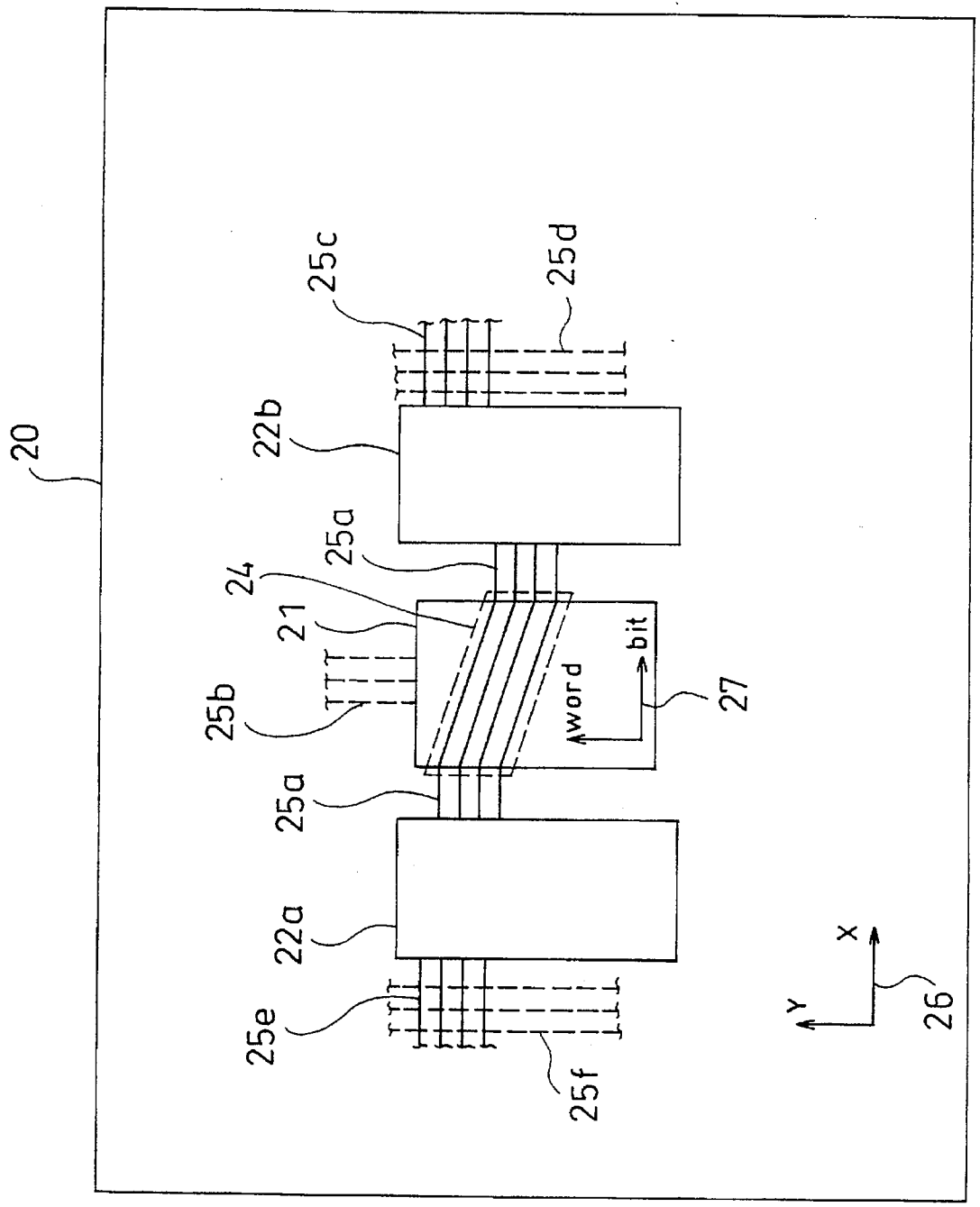
FIG. 2 illustrates the structure of a second SIC device of the present invention.

Preferred embodiments of the present invention are now described below by making reference to the attached drawing figures.

FIRST SIC DEVICE

FIG. 1 shows a first SIC device 10 in accordance with the present invention. The SIC device 10 has first-to fourth-level metal wiring layers including peripheral circuits of a memory module 11. These peripheral circuits of the memory module 11 are formed by word lines 13 and bit lines 14 in a lattice arrangement for performing read/write operations to memory cells 12. The word lines 13 are arranged in the first-level metal wiring layer. The word lines 14 are arranged in the second-level metal wiring layer. A first over-memory wire 15a without direct access to the memory cell 12 is arranged in the third-level metal wiring layer. A second over-memory wire 15b without direct access to the memory cell 12 is arranged in the fourth-level metal wiring layer. These first and second over-memory wires 15a and 15b are provided to interconnect functional circuit blocks.

Figure 6A:
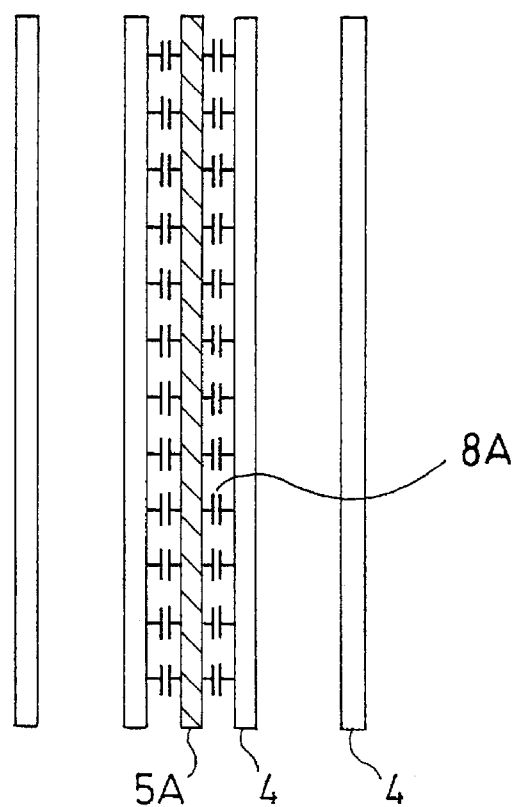
FIG. 6A shows, when an over-memory wire and a bit line are arranged in parallel with each other, the coupling capacitance of the over-memory wire and the bit line.
Figure 6B:
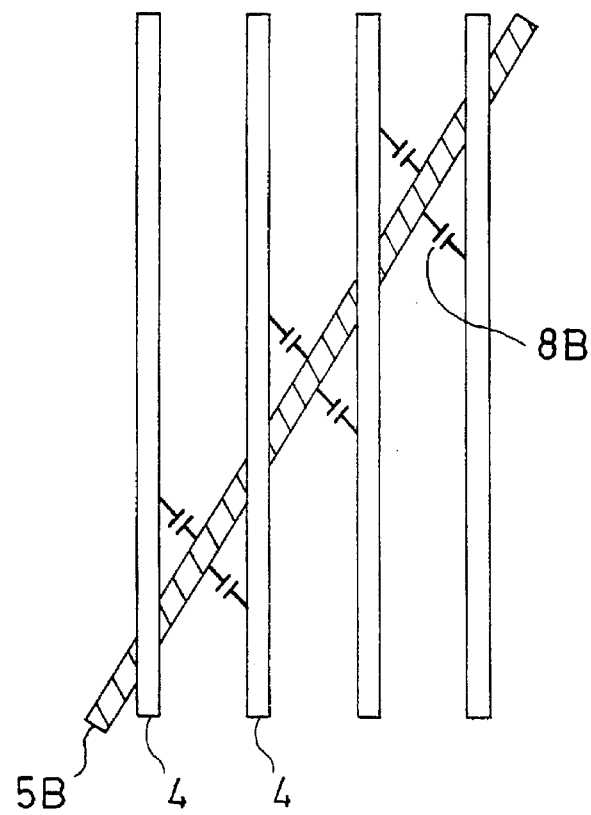
FIG. 6B shows, when an over-memory wire and a bit line are arranged to cross each other, the coupling capacitance of the over-memory wire and the bit line.

The first and second over-memory wires 15a, 15b cross over the word line 13 and the bit line 14. In the first embodiment of the present invention, the over-memory wires 15a, 15b cross over the lines 13, 14 at an angle of 45 degrees. As a result of such arrangement, the coupling capacitance between, for example, the word line 13 and the over-memory 15a is held low. This makes the occurrence of memory cell malfunctions less likely. The reason for this is explained by referring now to FIGS. 6A and 6B. FIG. 6A, on the one hand, shows a coupling capacitance 8A when an over-memory wire 5A runs parallel with a bit line 4. FIG. 6B, on the other hand, shows a coupling capacitance 8B when an over-memory wire 5B and a bit line 4 cross each other. Note that in FIG. 6B θ indicates the cross angle formed between the over-memory wire 5B and the bit line 4.

In the case of FIG. 6A where the over-memory wire 5A is arranged in parallel with the bit line 4, the coupling capacitance 8A has a maximum. As a result, crosstalk noise induced by the over-memory wire 5A in the bit line 4 has a maximum therefore increasing the possibility that memory cell malfunctions occur.

On the other hand, in the case of FIG. 6B where the cross angle θ is an acute angle, then the coupling capacitance 8B between the over-memory wire 5B and each bit line 4 is distributed. Because of this the coupling capacitance 8B between the over-memory wire 5B and a bit line 4 decreases, therefore reducing the crosstalk noise induced by the over-memory wire 5B in that bit line 4. As a result, the possibility that memory cell malfunctions occur is held low, therefore eliminating the need for taking measures to deal with noise as to the memory module. Usually a single bit line 4 is intersected by a plurality of over-memory wires 5B and it is most unlikely that all the over-memory wires 5B simultaneously make transitions in the same logic direction. Generally, it is considered that timings of transition are distributed and that the ratio of the occurrence of H→L transition and the ratio of the occurrence of L→H are almost equal. Because of the facts that noise induced by an over-memory wire 5B in a bit line 4 is offset by noise induced by another over-memory wire 5B that makes a transition in the opposite direction and that it is most unlikely for all the over-memory wires to make their respective transitions at the same time, it is most unlikely that memory cell malfunctions take place due to the presence of the over-memory wires 5B.

SECOND SIC DEVICE

FIG. 2 illustrates a second SIC device 20 in accordance with the present invention. The SIC device 20 has a memory module 21, a first functional circuit block 22a, a second functional circuit block 22b, an over-memory wire 24 passing over the memory module 21, and first to sixth interblock wires 25a, 25b, 25c, 25d, 25e, 25f. The first and second circuit blocks 22a and 22b are connected together by the first interblock wire 25a and the over-memory wire 24.

The interblock wires 25e, 25a, 25c run parallel with the x-axis of an interblock wiring coordinate system 26 that is a rectangular coordinate system, while the interblock wires 25f, 25b, 25d run parallel with the y-axis thereof. Bit lines of the memory module 21 run parallel with the x-axis of a memory module coordinate system 27 that is a rectangular coordinate system and word lines of the memory module 21 run parallel with the y-axis thereof.

The second embodiment is characterized in that the rotation angle of the interblock wiring coordinate system 26 with respect to the memory module coordinate system 27 is held at an angle of 0 degree and the over-memory wire 24 is arranged to extend across each of the x- and y- axes of the memory module coordinate system 27.

Accordingly, as in the first embodiment, the coupling capacitance between the word (bit) line of the memory module 21 and the over-memory wire 24 is held low. As a result, the possibility that memory cell malfunctions occurs to memory cells in the memory module 21 is reduced. Wiring layout, employed in the second embodiment, can be implemented by changing only an over-memory wiring algorithm with the aid of a conventional wiring arrangement tool.

THIRD SIC DEVICE

Figure 3:
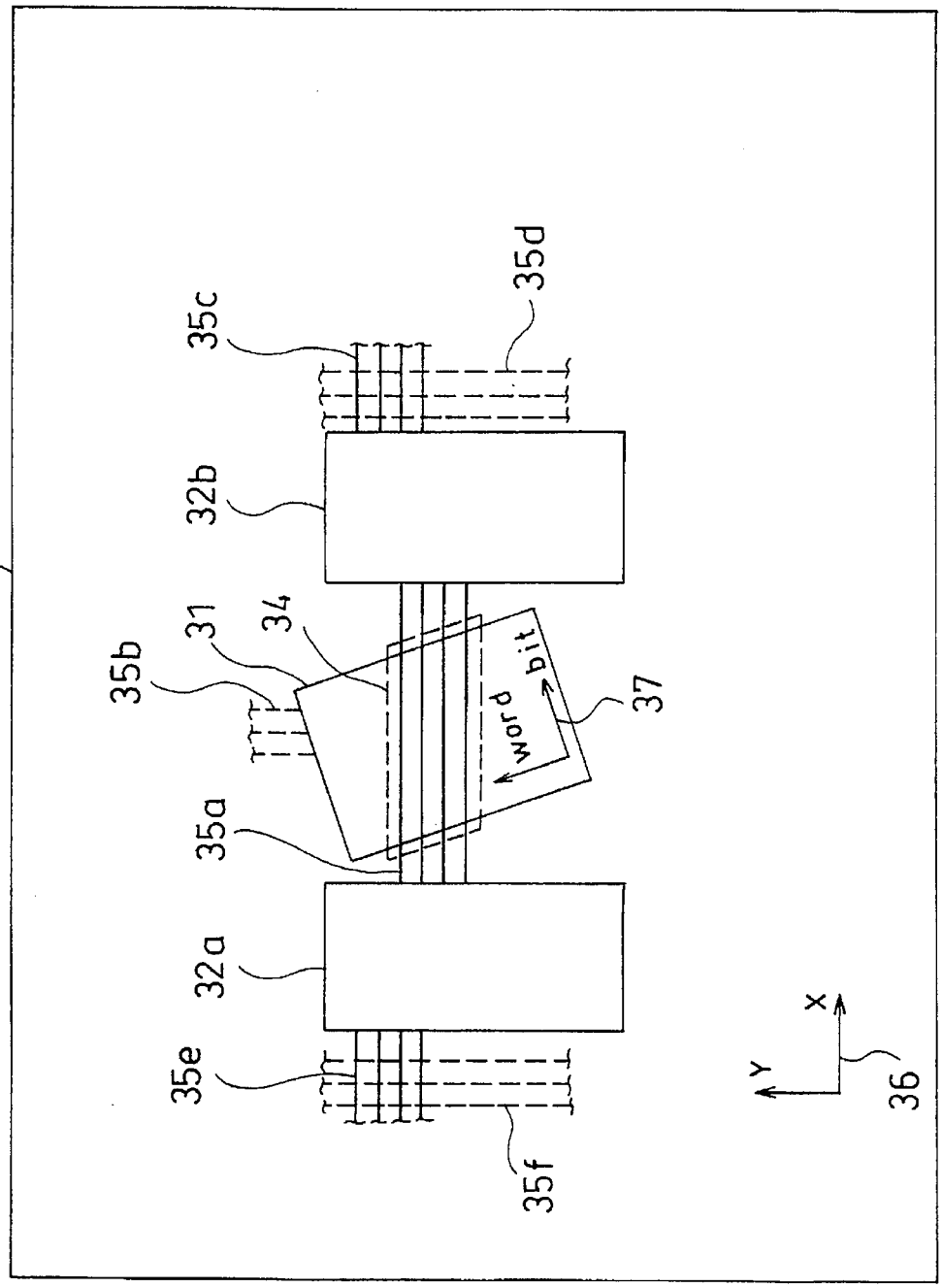
FIG. 3 illustrates the structure of a third SIC device of the present invention.

FIG. 3 illustrates a third SIC device 30 in accordance with the present invention. Like the second SIC device 20, the third SIC device 30 has a memory module 31, a first functional circuit block 32a, a second functional Circuit block 32b, an over-memory wire 34 passing over the memory module 31, and first to sixth interblock wires 35a, 35b, 35c, 35d, 35e, 35f. The first and second functional circuit blocks 32a and 32b are connected together by the first interblock wire 35a and the over-memory wire 34.

The interblock wires 35e, 35a, 35c run parallel with the x-axis of an interblock wiring coordinate system 36 that is a rectangular coordinate system, while the interblock wires 35f, 35b, 35d run parallel with the y-axis thereof. Bit lines of the memory module 31 run parallel with the x-axis of a memory module coordinate system 37 that is a rectangular coordinate system, while word lines of the memory module 31 run parallel with the y-axis thereof.

The third embodiment is characterized in that the coordinate system 36 and the coordinate system 37 cross each other in such a way as to form therebetween the rotation angle θ, and the over-memory wire 34 is arranged in such a way as to run parallel with either one of the axes of the interblock wiring coordinate system 36 and is arranged in such a way as to be intersected by each axis of the memory module coordinate system 37.

Accordingly, as in the first embodiment, the coupling capacitance of a word (bit) line of the memory module 31 and the over-memory wire 34 is held low. This makes the occurrence of memory cell malfunctions in the memory module 31 less likely. Wiring layout, employed in the third embodiment, can be implemented using a conventional wiring arrangement tool.

FOURTH SIC DEVICE

Figure 4:
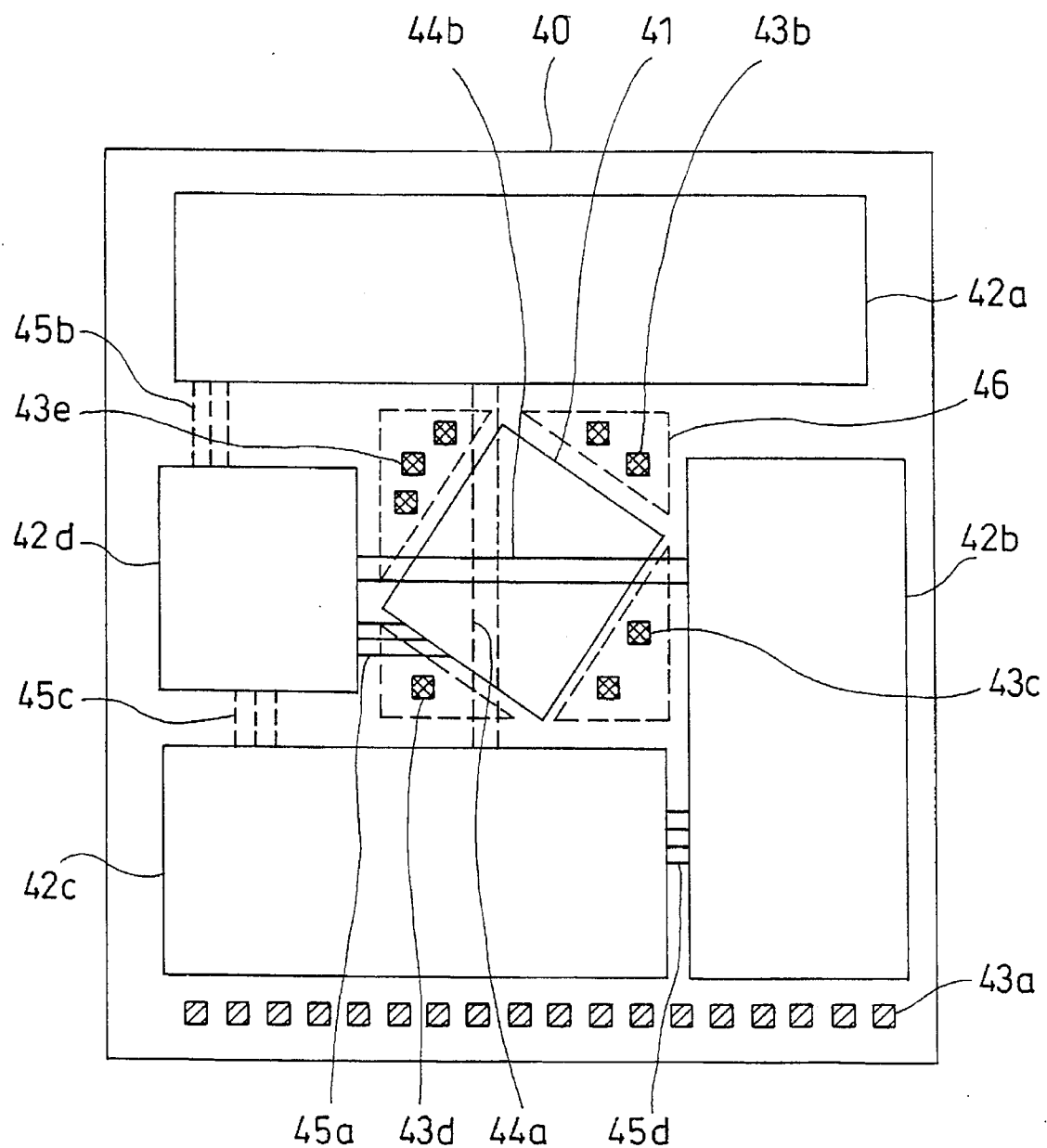
FIG. 4 illustrates the structure of a fourth SIC device of the present invention.

FIG. 4 shows a fourth SIC device 40 in accordance with the present invention. Like the third SIC device 30, the fourth SIC device 40 has a memory module 41, first to fourth functional circuit blocks 42a, 42b, 42c, 42d, first and second over-memory wires 44a, 44b passing over the memory module 41, and first to fourth interblock wires 45a, 45b, 45c, 45d. The first and third functional circuit blocks 42a and 42c are connected together by the first over-memory wire 44a, whereas the second and fourth functional circuit blocks 42b and 42d are connected together by the second over-memory wire 44b.

The interblock wires 45a and 45d run parallel with one of the axes of an interblock wiring coordinate system, while the interblock wires 45b and 45c run parallel with the other axis thereof. Bit lines of the memory module 41 run parallel with one of the axes of a memory module coordinate system, while word lines of the memory module 41 run parallel with the other axis thereof. These two coordinate systems cross each other at a rotation angle of θ. The over-memory wire 44a runs parallel with one of the axes of the interblock wiring coordinate system and extends across one of the axes of the memory module coordinate system, while the over-memory wire 44b runs parallel with the other axis of the interblock wiring coordinate system and extends across the other axis of the memory module coordinate system.

The fourth embodiment is characterized in that it has first to fifth input/output pad circuit blocks 43a, 43b, 43c, 43d, 43e for accepting data from SICs of the SIC device 40 or providing data to the SICs. The first i/o pad circuit block 43a is arranged along one of sides of the semiconductor substrate. On the other hand, the second to fifth i/o pad circuit blocks 43b, 43c, 43d, 43e are provided in respective triangular regions 46 defined between the memory module 41 and two adjacent i/o pad circuit blocks of the i/o pad circuit blocks 43a–d.

Accordingly, as in the first embodiment, the coupling capacitance of a word (bit) line and an over-memory wire is held low. As a result, the possibility that memory cell malfunctions occurs is reduced. Additionally the regions 46 are available.

FIFTH SIC DEVICE

Figure 5:
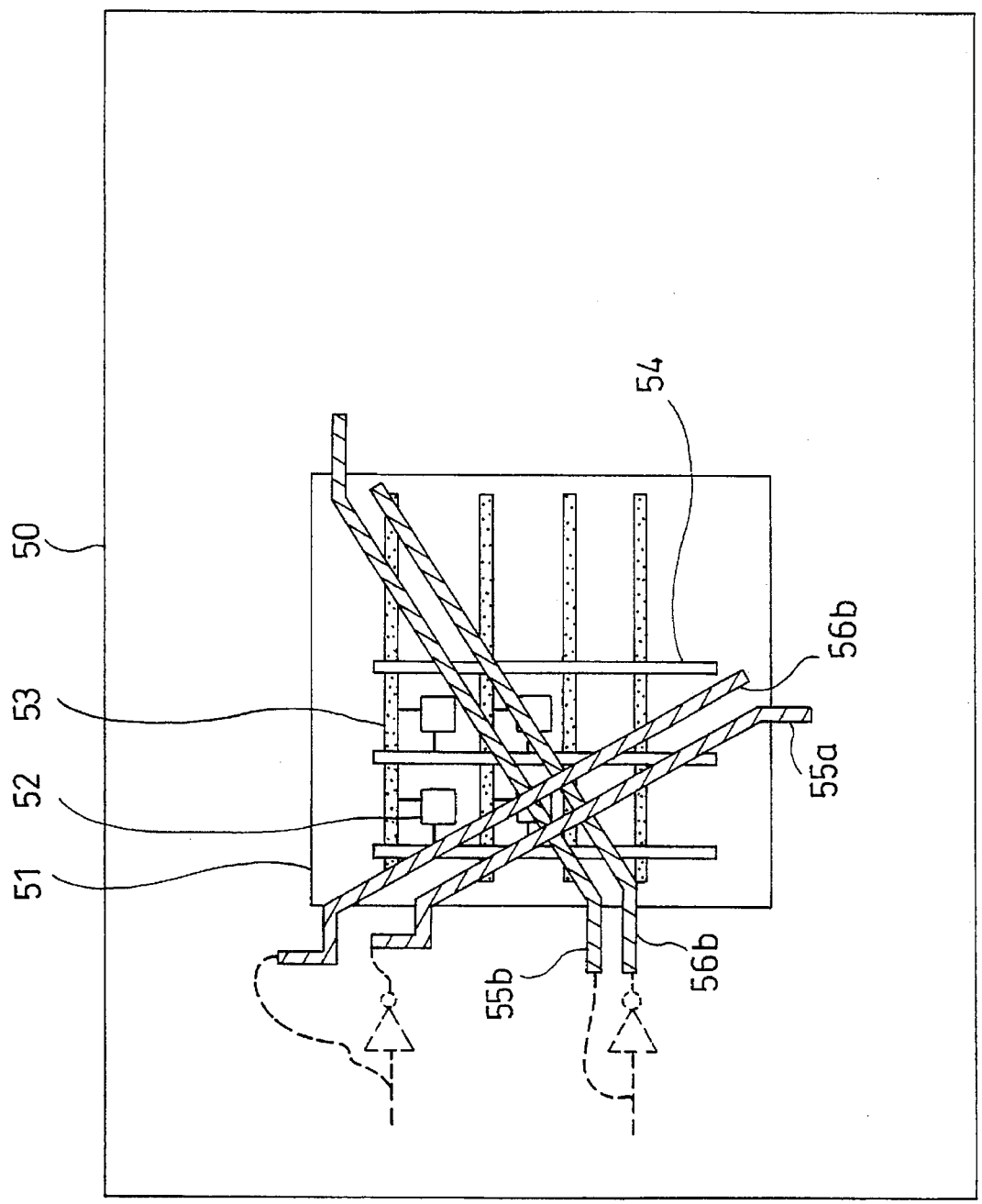
FIG. 5 illustrates the structure of a fifth SIC device of the present invention.

FIGURE 5 is an illustration of a fifth SIC device 50 in accordance with the present invention. The SIC device 50 has a memory module 51, a word line 53 and a bit line 54 for selectively performing read/write operations to a memory cell 52 of the memory module 51, and first and second over-memory wires 55a–b without direct access to the memory cell 52. As in the first SIC device 10, the over-memory wires 55a–b are arranged in such a way as to be intersected by the word line 53 and the bit line 54.

The fifth embodiment is characterized in that it has first and second dummy over-memory wires 56a and 56b. More specifically, the first dummy over-memory wire 56a is arranged next to and in parallel with the first over-memory wire 55a. Likewise the second dummy over-memory wire 56b is arranged next to and in parallel with the second over-memory wire 55b. The first dummy over-memory wire 56a is applied a complement of the signal that is applied to the first over-memory wire 55a. Likewise the second dummy over-memory wire 56b is applied a complement of the signal that is applied to the second over-memory wire 55b. The output impedance of a gate that drives such an inverted signal must be regulated such that it comes to have a magnitude of the reverse of the waveform of the over-memory wires 55a and 55b. Such arrangement guarantees that noise induced by a dummy over-memory wire in a bit (word) line is the reverse of a noise induced by a corresponding over-memory wire in that bit line.

With the above-described arrangement, even if many over-memory wires make their respective transitions at the same time in the same logic direction, noises induced by these over-memory wires are cancelled by corresponding dummy over-memory wires. This can eliminates the need for verifying that the coupling noise has become sufficiently small by means of time series signal trace in the SIC design verification phase.

In the fifth embodiment, the first and second over-memory wires 55a and 55b are arranged in such a way as to be intersected by the word line 53 and the bit line 54. However, where the first and second dummy over-memory wires 56a and 56b are provided, the first and second over-memory wires 55a and 55b are not necessarily intersected by the word line 53 and the bit line 54.

In each of the first to fifth embodiments, the memory module and the over-memory wire are formed on the same semiconductor substrate; however they may be formed on different semiconductor substrates which at a later stage are to be laminated together to form a single SIC device.

The invention claimed is:

1. A semiconductor integrated circuit device comprising:

a semiconductor substrate;

a memory module formed on said semiconductor substrate, said memory module comprising a plurality of memory cells each of which has a corresponding word line and bit line;

a plurality of functional circuits formed on said semiconductor substrate; and an over-memory wire formed on said semiconductor substrate, said over-memory wire operative for connecting two functional circuits of said plurality of functional circuits with each other, said two functional circuits forming a first pair of functional circuits, wherein said over-memory wire passes over said memory module and extends obliquely across both said word lines and said bit lines.

2. The semiconductor integrated circuit device of claim 1 further comprising:

an interblock wire formed on said semiconductor substrate, said interblock wire operative for connecting two different functional circuits from said first pair of functional circuits of said plurality of functional circuits with each other;

a first rectangular coordinate system for routing said word lines and said bit lines; and a second rectangular coordinate system for routing said interblock wire, wherein:

said interblock wire does not pass over said memory module;

respective coordinate axes of said first rectangular coordinate system are arranged to extend in parallel with or orthogonally to respective coordinate axes of said second rectangular coordinate system; and said over-memory wire extends obliquely across said coordinate axes of said second rectangular coordinate system.

3. The semiconductor integrated circuit device of claim 1 further comprising:

an interblock wire formed on said semiconductor substrate, said interblock wire operative for connecting two different functional circuits from said first pair of functional circuits of said plurality of functional circuits with each other;

a first rectangular coordinate system for routing said word lines and said bit lines; and a second rectangular coordinate system for routing said interblock wire, wherein:

respective coordinate axes of said first rectangular coordinate system are arranged to extend obliquely across respective coordinate axes of said second rectangular coordinate system; and said over-memory wire extends in parallel with or orthogonally to said coordinate axes of said second rectangular coordinate system.

4. The semiconductor integrated circuit device of claim 3 further comprising an input/output circuit pad for inputting a signal from outside said semiconductor integrated circuit device or outputting a signal from said semiconductor integrated circuit device;

said input/output circuit pad arranged within a triangular region defined by said memory module and two adjacent functional circuits of said plurality of functional circuits.

5. The semiconductor integrated circuit of claim 1, wherein said over-memory wire comprises a pair of wires capable of transmitting respective signals in a complementary relationship.

6. The semiconductor integrated circuit device of claim 1 further comprising:

a dummy over-memory wire formed on said semiconductor substrate;

said dummy over-memory wire extending over said memory module and extending parallel with and next to said over-memory wire;

said dummy over-memory wire transmitting a complement of a signal that is transmitted by said over-memory wire.

7. A semiconductor integrated circuit device comprising:

a semiconductor substrate;

a memory module formed on said semiconductor substrate, said memory module comprising a plurality of memory cells each of which has a corresponding word line and bit line;

a plurality of functional circuits formed on said semiconductor substrate;

an over-memory wire formed on said semiconductor substrate, said over-memory wire operative for connecting two functional circuits of said plurality of functional circuits with each other; and a dummy over-memory wire formed on said semiconductor substrate, said dummy over-memory wire operative for connecting said two functional circuits of said plurality of functional circuits with each other, wherein:

said over-memory wire passes over said memory module and extends obliquely across both said word lines and bit lines;

said dummy over-memory wire extends in parallel with and next to said over-memory wire; and said dummy over-memory wire transmits a complement of a signal that is transmitted by said over-memory wire.

8. The semiconductor integrated circuit device of claim 7 wherein said over-memory wire and said dummy over-memory wire are positioned between two adjacent bit lines of said memory module.

9. The semiconductor integrated circuit device of claim 7 wherein said over-memory wire and said dummy over-memory wire are placed so as to face each other with a bit line of said memory module between said over-memory wire and said dummy over-memory wire.

10. A semiconductor integrated circuit device comprising:

a first semiconductor substrate;

a second semiconductor substrate laminated to said first semiconductor substrate;

a memory module formed on said first semiconductor substrate, said memory module comprising a plurality of memory cells each of which has a corresponding word line and bit line;

a plurality of functional circuits formed on said second semiconductor substrate; and an over-memory wire formed on said second semiconductor substrate, said over-memory wire operative for connecting two functional circuits of said plurality of functional circuits;

wherein said over-memory wire extends obliquely across both said word lines and said bit lines.

* * * * *